United States Patent
Watanabe et al.

(10) Patent No.: US 7,727,597 B2
(45) Date of Patent: Jun. 1, 2010

(54) METHOD AND APPARATUS FOR PREPARING THIN FILM

(75) Inventors: Eizo Watanabe, 27-1, Kikari 4-chome, Inzai-shi, Chiba (JP) 270-1359; Toshiyuki Watanabe, Fuchu (JP); Masato Sone, Fuchu (JP); Yoshinori Matsuoka, Nishinomiya (JP); Hideo Miyake, Sakai (JP); Masayasu Iida, Sakai (JP)

(73) Assignees: Tokyo University of Agriculture & Tech., Tokyo (JP); Itec Co., Ltd., Sakai-shi (JP); Eizo Watanabe, Inzai-shi (JP)

( * ) Notice: Subject to any disclaimer, the term of this patent is extended or adjusted under 35 U.S.C. 154(b) by 0 days.

(21) Appl. No.: 11/719,806

(22) PCT Filed: Sep. 30, 2005

(86) PCT No.: PCT/JP2005/018101

§ 371 (c)(1),
(2), (4) Date: Jun. 4, 2007

(87) PCT Pub. No.: WO2006/054393

PCT Pub. Date: May 26, 2006

(65) Prior Publication Data

US 2008/0166491 A1    Jul. 10, 2008

(30) Foreign Application Priority Data

Nov. 22, 2004  (JP)  ............... 2004-337176
Nov. 22, 2004  (JP)  ............... 2004-337177

(51) Int. Cl.
*B05D 1/02* (2006.01)
*B05D 5/00* (2006.01)
*B05D 7/00* (2006.01)
*B28B 19/00* (2006.01)
*C23C 20/00* (2006.01)
*C23C 28/00* (2006.01)

(52) U.S. Cl. .................. 427/427.7; 427/421.1; 427/328; 427/331; 118/302

(58) Field of Classification Search .............. 427/248.1, 427/328, 421.1, 427.7, 331; 118/302
See application file for complete search history.

(56) References Cited

U.S. PATENT DOCUMENTS 4,603,168 A * 7/1986 Sasaki et al. .................. 522/18

(Continued)

FOREIGN PATENT DOCUMENTS

JP    2000-77342    3/2000

(Continued)

*Primary Examiner*—Nadine G Norton
*Assistant Examiner*—Mahmoud Dahimene
(74) *Attorney, Agent, or Firm*—Rankin, Hill & Clark LLP

(57) ABSTRACT

The present invention provides a method and an apparatus for preparing a silicon-containing solid film, which can form a thin film uniformly over a wide area. Raw-material fluid comprising a silane derivative and a hydrocarbon derivative is mixed with carrier fluid comprising carbon dioxide to form a supercritical condition. Further, an active-state is produced in the raw-material fluid of the supercritical fluid by a catalytic reaction with at least one metal catalyst selected from a group consisting of platinum, tungsten, cobalt, nickel, iron or an alloy of each of them. The fluid is blown to the substrate, thereby forming a silicon-containing solid film or a hydrocarbon-containing solid film on the substrate.

7 Claims, 1 Drawing Sheet

U.S. PATENT DOCUMENTS

| | | | |
|---|---|---|---|
| 5,238,669 A * | 8/1993 | Sullivan | 423/344 |
| 5,417,953 A * | 5/1995 | Cappelli | 423/446 |
| 2002/0090458 A1* | 7/2002 | Cotte et al. | 427/331 |
| 2004/0096586 A1* | 5/2004 | Schulberg et al. | 427/372.2 |
| 2004/0188778 A1* | 9/2004 | Aoyama | 257/410 |
| 2006/0068583 A1* | 3/2006 | Kawamura et al. | 438/623 |

FOREIGN PATENT DOCUMENTS

| | | |
|---|---|---|
| JP | 2000-195801 | 7/2000 |
| JP | 2000-239846 | 7/2000 |
| JP | 2000-226624 | 8/2000 |
| JP | 2001-287910 | 10/2001 |
| JP | 2003-82463 | 3/2003 |
| JP | 2004-303894 | 10/2004 |

* cited by examiner

METHOD AND APPARATUS FOR PREPARING THIN FILM

TECHNICAL FIELD

The present invention relates to a method for preparing a thin film, which forms a solid film on a surface of a substrate or the like thinly and uniformly.

BACKGROUND ART

There is a method using plasma CVD device as a conventionally known example of the method for forming a solid film on the surface of the substrate or the like (Patent Literature 1).

Patent Literature 1: Patent Publication Hei 6-60404

However, in the case of forming the thin film on the surface of the substrate or the like by using the plasma CVD device, there was a problem that the chamber must have the pressure of its interior area reduced. This restrains the size of the substrate and besides entails a difficulty in making the plasma to act evenly. There was another problem that the active-state to be to be produced and the raw material are low in concentration and the thin-film growth speed is slow due to the fact that the thin film is grown from the vapor phase.

Particularly, in the case of forming polysilicon film, there was a problem that the hydrogen produced from the raw material readily remains in the film with the result of being unable to exert a sufficient performance. Further, in recent years, a catalyst CVD method has been developed as a novel film-preparing method which can make a polysilicon film or a silicon nitride film on a glass substrate of low strain at a low temperature and a study is promoted on the way how to put it into practice. This catalyst CVD method can provide a polysilicon film having a mobility of electron and hole of about 0 to 50 $cm^2/V \cdot sec$ without the annealing treatment. However, the mobility of this film is not sufficient.

DISCLOSURE OF THE INVENTION

The present invention has been created from the viewpoint of those above facts and has an object of providing a method and an apparatus able to prepare a thin film of a high mobility uniformly at a low temperature over a wide area and at a high speed.

Means for Solving the Problem

In order to accomplish the above-mentioned object, the invention as set forth in claim 1 blows carrier fluid and raw-material fluid under a supercritical condition to a catalyst contained in a chamber so as to cause a contact reaction of the catalyst and the fluid by which reaction at least part of the raw-material fluid is decomposed and a substrate is exposed to an atmosphere of the active-state produced by the decomposition to form a solid film such as a silicon-containing solid film, a carbon-containing solid film and the like.

The present invention decomposes at least part of the raw-material fluid by the contact of the raw-material fluid with the catalyst to form a radical of a substance contained in the raw-material fluid so as to form a solid film on a surface of a substrate placed in the atmosphere of the radical.

Further, the hydrogen produced by the decomposition is promptly dissolved in supercritical fluid of the carrier fluid and therefore does not remain in the film. This forms the whole interior area of the chamber into a homogeneous atmosphere to result in the possibility of preparing the solid film over the entire substrate uniformly.

EFFECT OF THE INVENTION

The present invention places the carrier fluid and the raw-material fluid in the supercritical condition and introduces them into the chamber so as to bring them into contact with the device for producing the active-state (catalyst) within the chamber, thereby forming the radial of the element contained in the raw-material fluid with the result of being able to prepare a thin and minute solid film at a low temperature. Therefore, it was possible to obtain even on the glass or plastic substrate of low vitreous transition temperature a polysilicon film of good quality that was difficult to obtain conventionally.

Besides, in this case, the raw-material fluid has a concentration far higher than by the CVD device commonly used to result in enhancing the frequency of the occurrence of nucleus. Thus it is possible to prepare a homogeneous thin film free of pin holes in its entirety. Additionally, since there is no need of vacuuming the atmosphere within the chamber, the workability becomes excellent.

MOST PREFERRED EMBODIMENT OF THE INVENTION

Figure 1:
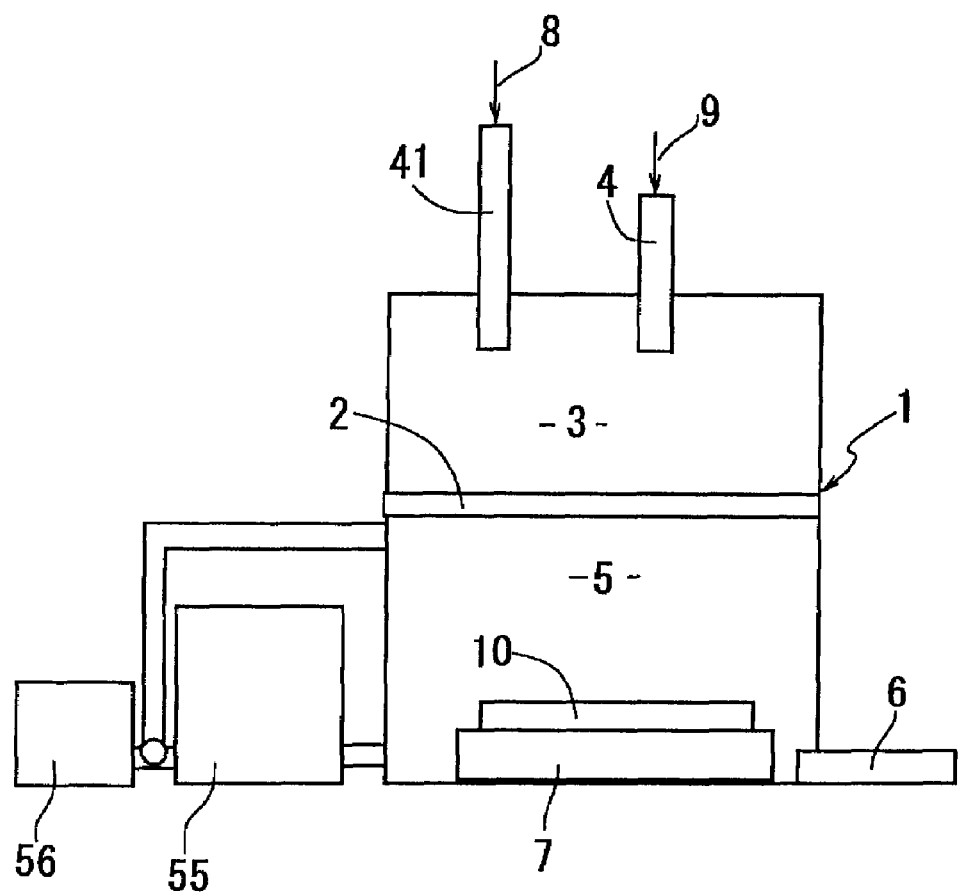
FIG. 1 is a schematic constructional view showing an example of the device for embodying the present invention.

FIG. 1 shows an example of the device for embodying the present invention. There is arranged within a chamber 1 a device for producing an active-state 2 which partitions an interior area of the chamber 1. An inlet 4 for introducing raw-material fluid is positioned in one space 3 partitioned by this active-state production device 2 and a gas discharge-outlet 6 is disposed in the other space 5 in which a substrate 7 is positioned.

Used for the active-state production device 2 is a resistance-heating element which comes to be a catalyst, such as platinum, tungsten, cobalt, nickel, iron or an alloy of each of them. The resistance-heating element is employed by heating it up to a temperature of not more than 2000 degrees C. and arranging the reaction conditions. The catalyst may be heated through laser or electromagnetic wave. In this case, the temperature of 2000 degrees C. is a temperature at which carbon dioxide causes the plasma phenomenon and the catalyst is heated to a temperature region where the plasma phenomenon does not occur at a temperature exceeding the critical temperature of 31 degrees C. of carbon dioxide.

In addition, it is possible to utilize a platinum wire and an iron wire for the active-state production device 2.

In the case of forming a silicon-containing solid film, carbon dioxide 8 as a carrier fluid is introduced from an inlet 41 for introducing the carrier fluid and at the same time a compound selected from the group consisting of silane, silicon tetrachloride, trichlorosilane, dichlorosilane, monochlorosilane, tetrakisdimethylaminosilane, trisdimethylaminosilane, bisdimethylaminosilane and dimethylaminosilane (hereinafter sometimes referred to as a "silane derivative") is introduced from the raw-material fluid introduction inlet 4 into the chamber 1 to mix the carrier fluid and the raw-material fluid for use. The thus mixed fluid is brought into contact with the active-state production device 2 under a supercritical condition.

Further, used for the substrate 7 is a glass substrate, an aluminium substrate, a silicon substrate and a synthetic-resin substrate.

In the method for preparing solid film constructed as above, carbon dioxide 8 as the carrier fluid and the silane derivative 9 as a silicon source are supplied under the supercritical condition respectively into the chamber 1. If carbon dioxide 8 and the silane derivative 9 are introduced under the supercritical condition, both fluids are uniformly mixed to contact the active-state production device 2, thereby decomposing the silane derivative to silicon and hydrogen. This free silicon reaches the surface of the substrate 7 to form a thin, fine and solid crystalline silicon film 10. At this time, the carbon dioxide acts as a carrier gas but it is not the raw material of the free silicon.

The hydrogen gas produced by the decomposition of the raw-material fluid upon contact with the active-state production device 2 is smoothly dissolved into the carbon dioxide in supercritical condition and is discharged together with the introduced carbon dioxide through the gas discharge-outlet 6.

In the above-mentioned embodiment, carbon dioxide and silane derivative are introduced under supercritical condition independently into the chamber 1. However, the carbon dioxide and the silane derivative are mixed under supercritical condition and the resulting mixture may be introduced into the chamber 1.

On the other hand, in the case of forming a carbon-containing solid film, the carbon dioxide 8 as the carrier fluid is introduced through an inlet 41 for introducing the carrier fluid and a hydrocarbon derivative 9 as the raw-material fluid is introduced into the chamber 1 through the inlet 4 for introducing the raw-material. The carrier fluid and the raw-material fluid are mixed for use. The thus mixed fluid is brought into contact with the active-state production device 2 in supercritical condition.

As such, in the case of using the hydrocarbon derivative as the raw-material fluid, the hydrocarbon derivative is decomposed into carbon and hydrogen. This free carbon reaches the surface of the substrate 7 to form a thin, fine and solid polycrystalline diamond-like carbon film.

Embodiment 1

First, a pre-washed glass substrate 7 is set within the chamber 1. Next, a turbo-molecular pump 55 and a rotary pump 56 are activated to reduce the pressure within the chamber 1 to about 1 to $2 \times 10^{-6}$ Pa. While this state is maintained for about 5 minutes, particularly moisture and oxygen carried into the chamber are discharged. Further, the substrate 7 has its temperature heated to 200 degrees C. and held at this temperature.

Subsequently, the active-state production device (platinum-system catalyst) 2 is energized to raise its temperature up to about 1600 to 1800 degrees C. In this embodiment, it is set to 1800 degrees C. and is held in this state for 10 minutes.

Then silane ($SiH_4$) is introduced from the reaction-gas control system into the chamber 1. More specifically, gas of raw material is supplied into chamber 1 by regulating the flow of supercritical carbon dioxide at 90 sccm/min and the flow of $SiH_4$ at 9 sccm/min (100% silane). The chamber has its inner pressure kept at 5 Mpa and has its temperature retained at 50 degrees C. Film-formation is conducted at a speed of 80 nm/min for 1 minute to form a silicon film of about 40 nm thickness.

If the gas of raw material is supplied into the chamber 1 as such, the active-state production device 2 supplies to this gas, energy which allows this gas to make chemical reaction. This chemical reaction decomposes $SiH_4$ to produce Si. As mentioned-above, silicon has deposited on the surface of the glass substrate 7 to form a silicon film at a high speed. The obtained silicon film has a diameter of crystalline particle controlled to a desired particle diameter not more than 100 nm (for example, fine particle diameter of about 1 to 2 nm) owing to the film-formation conditions because it was formed by the device of the present invention. Further, its content of hydrogen is so inhibited that the atom ratio is about 0.1 to 2.0 at %.

After it has been formed into the silicon film 10 as such, the reaction-gas control system regulates the flow of $SiH_4$ gas to 0 and enables only carbon dioxide to continuously flow. And after this state is continued for 5 minutes, power supply to the active-state production device 2 is stopped to decrease its temperature. Subsequently, the flow of the carbon dioxide is regulated to 0 and further the interior area of the reaction chamber 51 has its pressure reduced to 1 to about $2 \times 10^{-6}$ Pa. This state is maintained for about 5 minutes and particularly the $SiH_4$ that was introduced into the chamber is discharged. Then the interior area of the chamber is returned to the atmospheric pressure and the glass substrate 7 is removed out of the camber 1. This film has a mobility of electron and hole of about 0 to 100 $cm^2/V \cdot sec$. without being subjected to the annealing treatment.

Embodiment 2

First, a pre-washed glass substrate 7 is set within the chamber 1. Next, a turbo-molecular pump 55 and a rotary pump 56 are activated to reduce the pressure within the chamber 1 to about 1 to $2 \times 10^{-6}$ Pa. While this state is maintained for about 5 minutes, particularly moisture and oxygen carried into the chamber are discharged. Further, the substrate 7 has its temperature heated to 200 degrees C. and held at this temperature.

Subsequently, the active-state production device (platinum-system catalyst) 2 is energized to raise its temperature up to about 1600 to 1800 degrees C. In this embodiment, it is set to 1800 degrees C. and is held in this state for 10 minutes.

Then dimethylaminosilane is introduced from the reaction-gas control system into the chamber 1. More specifically, gas of raw material is supplied into chamber 1 by regulating the flow of supercritical carbon dioxide at 90 sccm/min and the flow of dimethylaminosilane at 9 sccm/min (100% dimethylaminosilane). The chamber has its inner pressure kept at 5 Mpa and has its temperature retained at 50 degrees C. Film-formation is conducted at the speed of 80 nm/min for 1 minute to form a silicon film 10 of about 40 nm thickness.

If the gas of raw material is supplied into the chamber 1 as such, the active-state production device 2 decomposes the gas of raw material, thereby isolating an amino group and a methyl group which change to silane radicals. They make reaction, so that as mentioned-above, silicon has deposited on the surface of the glass substrate 7 to form a silicon film at a high speed. The obtained silicon film has a diameter of crystalline particle controlled to a desired particle diameter not more than 100 nm (for example, fine particle diameter of about 1 to 2 nm) owing to the film-formation conditions because it was formed by the device of the present invention. Further, its content of hydrogen is so inhibited that the atom ratio is about 0.1 to 2.0 at %.

After the silicon film 10 has been formed according to the above-mentioned procedures, the reaction-gas control system regulates the flow of dimethylaminosilane gas to 0 and enables only carbon dioxide to continuously flow. And after this state is continued for 5 minutes, power supply to the active-state production device 2 is stopped to decrease its temperature. Subsequently, the flow of the carbon dioxide is regulated to 0 and further the interior area of the reaction chamber 1 has its pressure reduced to about 1 to $2\times10^{-6}$ Pa. This state is maintained for about 5 minutes and particularly the $SiH_4$ that was introduced into the chamber is discharged. Then the interior area of the chamber is returned to the atmospheric pressure and the glass substrate 7 is removed out of the camber 1. This film had a mobility of electron and hole of about 0 to 150 $cm^2/V\cdot sec$. without being subjected to the annealing treatment.

Embodiment 3

First, a pre-washed glass substrate 7 is set within the chamber 1. Next, the turbo-molecular pump 55 and the rotary pump 56 are activated to reduce the pressure within the chamber 1 to about 1 to $2\times10^{-6}$ Pa. While this state is held for about 5 minutes, particularly moisture and oxygen carried into the chamber are discharged. Further, the substrate 7 has its temperature heated to 200 degrees C. and held at this temperature.

Subsequently, the active-state production device (platinum-system catalyst) 2 is energized to raise its temperature up to about 1600 to 1800 degrees C. In this embodiment, it is set to 1800 degrees C. and is held in this state for 10 minutes.

Then methane ($CH_4$) is introduced from the reaction-gas control system into the chamber 1. More specifically, gas of raw material is supplied into chamber 1 by regulating the flow of supercritical carbon dioxide at 90 sccm/min and the $CH_4$ flow at 9 sccm/min (100% methane). The chamber has its inner pressure kept at 5 Mpa and has its temperature retained at 50 degrees C. Film-formation is conducted at the speed of 80 nm/min for 1 minute to form a diamond-like carbon film (DLC) of about 40 nm thickness.

If the gas of raw material is supplied into the chamber 1 as such, the active-state production device 2 supplies to the gas of raw material, energy for enabling them to make a chemical reaction, thereby decomposing $CH_4$ to produce C. Then, as mentioned-above, carbon has deposited on the surface of the glass substrate 7 to form a diamond-like carbon film 10 at a high speed. The obtained diamond-like carbon film has a diameter of crystalline particle controlled to a desired particle diameter not more than 100 nm (for example, fine particle diameter of about 1 to 2 nm) owing to the film-formation conditions because it was formed by the device of the present invention. Further, its content of hydrogen is so inhibited that the atom ratio is about 0.1 to 2.0 at %.

After it has been formed into the diamond-like carbon film 10 as such, the reaction-gas control system regulates the flow of $CH_4$ gas to 0 and enables only carbon dioxide to continuously flow. And after this state is continued for 5 minutes, power supply to the active-state production device 2 is stopped to decrease its temperature. Subsequently, the flow of the carbon dioxide is also regulated to 0 and further the interior area of the reaction chamber 51 has its pressure reduced to about 1 to $2\times10^{-6}$ Pa. This state is maintained for about 5 minutes and particularly the $CH_4$ that was introduced into the chamber is discharged. Then the interior area of the chamber is returned to the atmospheric pressure and the glass substrate 7 is removed out of the camber 1.

Embodiment 4

First, a pre-washed glass substrate 7 is set within the chamber 1. Next, the turbo-molecular pump 55 and the rotary pump 56 are activated to reduce the pressure within the chamber 1 to about 1 to $2\times10^{-6}$ Pa. While this state is maintained for about 5 minutes, particularly moisture and oxygen carried into the chamber are discharged. Further, the substrate 7 has its temperature heated to 200 degrees C. and held at this temperature.

Subsequently, the active-state production device (platinum-system catalyst) 2 is energized to raise its temperature up to about 1600 to 1800 degrees C. In this embodiment, it is set to 1800 degrees C. and is held in this state for 10 minutes.

Then methanol ($C_2H_5OH$) is introduced from the reaction-gas control system into the chamber 1. More specifically, gas of raw material is supplied into chamber 1 by regulating the flow of supercritical carbon dioxide at 90 sccm/min and the flow of the methanol at 9 sccm/min (100% methanol). The chamber has its inner pressure kept at 5 Mpa and has its temperature retained at 50 degrees C. Film-formation is conducted at the speed of 80 nm/min for 1 minute to form a silicon film of about 40 nm thickness.

If the gas of raw material is supplied into the chamber 1 as such, the active-state production device 2 decomposes the gas of raw material, thereby first producing a carbon radical and then isolating hydrogen. They make a reaction. As a result, as mentioned-above, carbon has deposited on the surface of the glass substrate 7 to form a diamond-like carbon film 10 at a high speed. The obtained diamond-like carbon film has a diameter of crystalline particle controlled to a desired particle diameter not more than 100 nm (for example, fine particle diameter of about 1 to 2 nm) owing to the film-formation conditions because it was formed by the device of the present invention. Further, its content of hydrogen is so inhibited that the atom ratio is about 0.1 to 2.0 at %.

After the diamond-like carbon film 10 has been formed as such, the reaction-gas control system regulates the flow of methanol gas to 0 and enables only carbon dioxide to continuously flow. And after this state is continued for 5 minutes, power supply to the active-state production device 2 is stopped to decrease its temperature. Subsequently, the flow of the carbon dioxide is also regulated to 0 and further the interior area of the chamber 1 has its pressure reduced to about 1 to $2\times10^{-6}$ Pa. This state is maintained for about 5 minutes and particularly the $CH_4$ that was introduced into the chamber is discharged.

INDUSTRIAL AVAILABILITY

The present invention makes it possible to form a thin and fine silicon-containing solid film or carbon-containing solid film (DLC) on the surface of the substrate. Therefore, it is available for the field of producing various sorts of tools, jigs, friction-resistant materials, speaker vibration boars, wall materials for the nuclear fusion reactor, semi-conductor elements and the like.

The invention claimed is:

1. A method of preparing a polysilicon film on a substrate, the method comprising the steps of:
    contacting a raw-material fluid containing a compound selected from the group consisting of silane, silicon tetrachloride, trichlorosilane, dichlorosilane, monochlorosilane, tetrakisdimethylaminosilane, trisdimethylaminosilane, bisdimethylaminosilane and dimethylaminosilane and a carrier fluid together to form a mixture that is in a supercritical state;
    decomposing the compound in the mixture using a catalyst disposed within a chamber to form a radical; and
    contacting the substrate with the radical in the chamber to form the polysilicon film on the substrate.

2. The method according to claim 1, wherein the catalyst is at least one metal selected from a group consisting of platinum, tungsten, cobalt, nickel, iron and alloys thereof.

3. The method according to claim 1, wherein the raw-material fluid and the carrier fluid are contacted together to form the mixture before the mixture is introduced into the chamber.

4. The method according to claim 1, where the raw-material fluid and the carrier fluid are independently introduced into the chamber and contacted together therein to form the mixture.

5. The method according to claim 1, wherein the silane derivative compound is dimethylaminosilane.

6. The method according to claim 1, wherein the carrier fluid is carbon dioxide.

7. A method for producing a polysilicon comprising:
contacting a raw-material fluid containing a compound selected from the group consisting of silane, silicon tetrachloride, trichlorosilane, dichlorosilane, monochlorosilane, tetrakisdimethylaminosilane, tris-dimethylaminosilane, bisdimethylaminosilane and dimethylaminosilane and a carrier fluid together to form a mixture that is in a supercritical state;
decomposing the compound in the mixture using a catalyst disposed within a chamber to form a radical; and
contacting a substrate with the radical in the chamber to form the polysilicon on the substrate.

* * * * *

UNITED STATES PATENT AND TRADEMARK OFFICE
CERTIFICATE OF CORRECTION

PATENT NO.        : 7,727,597 B2                                                                 Page 1 of 1
APPLICATION NO. : 11/719806
DATED             : June 1, 2010
INVENTOR(S)       : Watanabe et al.

It is certified that error appears in the above-identified patent and that said Letters Patent is hereby corrected as shown below:

In Column 7, Lines 10-11, in Claim 5, after "wherein the" delete "silane derivative"

Signed and Sealed this

Nineteenth Day of October, 2010

David J. Kappos
*Director of the United States Patent and Trademark Office*